(12) United States Patent
Chan et al.

(10) Patent No.: US 9,437,717 B2
(45) Date of Patent: Sep. 6, 2016

(54) INTERFACE CONTROL IN A BIPOLAR JUNCTION TRANSISTOR

(71) Applicant: GLOBALFOUNDRIES INC., Grand Cayman (KY)

(72) Inventors: Kevin K. Chan, Staten Island, NY (US); Peng Cheng, South Burlington, VT (US); Qizhi Liu, Lexington, MA (US); Ljubo Radic, Torrance, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 138 days.

(21) Appl. No.: 13/971,982

(22) Filed: Aug. 21, 2013

(65) Prior Publication Data

US 2013/0334664 A1 Dec. 19, 2013

Related U.S. Application Data

(62) Division of application No. 13/297,464, filed on Nov. 16, 2011, now Pat. No. 8,603,883.

(51) Int. Cl.
| | |
|---|---|
| *H01L 29/73* | (2006.01) |
| *H01L 29/66* | (2006.01) |
| *H01L 29/737* | (2006.01) |
| *H01L 29/10* | (2006.01) |
| *G06F 17/50* | (2006.01) |

(52) U.S. Cl.
CPC .......... *H01L 29/73* (2013.01); *G06F 17/5045* (2013.01); *H01L 29/1004* (2013.01); *H01L 29/66272* (2013.01); *H01L 29/7371* (2013.01)

(58) Field of Classification Search
CPC ........ H01L 29/70; H01L 29/72; H01L 29/73
See application file for complete search history.

(56) References Cited

U.S. PATENT DOCUMENTS

| | | |
|---|---|---|
| 5,432,120 A | 7/1995 | Meister et al. |
| 5,587,327 A | 12/1996 | Konig et al. |
| 5,729,033 A | 3/1998 | Hafizi |
| 6,620,732 B1 | 9/2003 | Schuegraf |
| 6,906,401 B2 | 6/2005 | Dunn et al. |
| 7,235,861 B1 | 6/2007 | Howard et al. |
| 7,625,793 B2 | 12/2009 | Calafut |

(Continued)

OTHER PUBLICATIONS

S. S. Lu et al., "High-current-gain Ga0.51In0.49P/GaAs heterojunction bipolar transistor grown by gas-source molecular beam epitaxy," IEEE Electron Device Letters, vol. 13, No. 4, Apr. 1992, pp. 214-216.

(Continued)

*Primary Examiner* — Jae Lee
(74) *Attorney, Agent, or Firm* — Thompson Hine LLP; Anthony Canale (57) ABSTRACT

Methods of fabricating bipolar junction transistors, bipolar junction transistors, and design structures for a bipolar junction transistor. A first portion of the intrinsic base layer is masked while a second portion of an intrinsic base layer is etched. As a consequence of the masking, the second portion of the intrinsic base layer is thinner than the first portion of the intrinsic base layer. An emitter and an extrinsic base layer are formed in respective contacting relationships with the first and second portions of the intrinsic base layer.

10 Claims, 6 Drawing Sheets

(56) References Cited

U.S. PATENT DOCUMENTS

| | | | |
|---|---|---|---|
| 8,630,113 B1* | 1/2014 | Xu et al. ....................... 365/180 |
| 2006/0011944 A1* | 1/2006 | Fujiwara ............. H01L 29/0804 257/197 |
| 2006/0043529 A1* | 3/2006 | Chidambarrao et al. ..... 257/565 |
| 2007/0275535 A1 | 11/2007 | Khater et al. |
| 2008/0078997 A1 | 4/2008 | Khater |
| 2008/0230869 A1 | 9/2008 | Ho et al. |
| 2008/0277699 A1 | 11/2008 | Chakravarthi et al. |
| 2008/0305602 A1 | 12/2008 | Fu |
| 2009/0321880 A1* | 12/2009 | Aoki ................... H01L 29/1004 257/591 |
| 2011/0057266 A1 | 3/2011 | Wallner et al. |

OTHER PUBLICATIONS

C. A. King et al., "Integratable and low base resistance Si1Si1-xGex heterojunction bipolar transistors using selective and non-selective rapid thermal epitaxy," International Electron Devices Meeting, Dec. 10-13, 1995, pp. 751-754.

J. Schiz et al., "A novel self-aligned SiGe HBT structure using selective and non-selective epitaxy," 1997 Workshop on High Performance Electron Devices for Microwave and Optoelectronic Applications, EDMO, Nov. 24-25, 1997, pp. 255-260.

USPTO, Notice of Allowance issued in U.S. Appl. No. 13/297,464 dated Aug. 2, 2013.

USPTO, Office Action issued in U.S. Appl. No. 13/297,464 dated Feb. 15, 2013.

* cited by examiner

INTERFACE CONTROL IN A BIPOLAR JUNCTION TRANSISTOR

CROSS-REFERENCE TO RELATED APPLICATIONS

This application is a divisional of application Ser. No. 13/297,464, filed Nov. 16, 2011, which is hereby incorporated by reference herein in its entirety.

BACKGROUND

The present invention relates to semiconductor device fabrication and, more specifically, to bipolar junction transistors, methods of fabricating bipolar junction transistors, and design structures for a bipolar junction transistor.

Bipolar junction transistors are typically found in demanding types of integrated circuits, especially integrated circuits for high-frequency applications. One high-frequency application for bipolar junction transistors is in radiofrequency integrated circuits (RFICs), which are used in wireless communications systems, power amplifiers in cellular telephones, and other types of high speed integrated circuits. Bipolar junction transistors may also be combined with complementary metal-oxide-semiconductor (CMOS) field effect transistors in bipolar complementary metal-oxide-semiconductor (BiCMOS) integrated circuits, which take advantage of the positive characteristics of both transistor types in the construction of the integrated circuit.

Conventional bipolar junction transistors are three-terminal electronic devices that include three semiconductor regions, namely an emitter, a base, and a collector. Generally, a bipolar junction transistor includes a pair of p-n junctions, namely a collector-base junction and an emitter-base junction. A voltage applied across the emitter-base junction of a bipolar junction transistor controls the movement of charge carriers that produce charge flow between the collector and emitter regions of the bipolar junction transistor.

An NPN bipolar junction transistor includes two regions of n-type semiconductor material constituting the emitter and collector, and a region of p-type semiconductor material sandwiched between the two regions of n-type semiconductor material to constitute the base. A PNP bipolar junction transistor has two regions of p-type semiconductor material constituting the emitter and collector, and a region of n-type semiconductor material sandwiched between two regions of p-type semiconductor material to constitute the base.

Improved bipolar junction transistors, methods of fabricating bipolar junction transistors, and design structures for bipolar junction transistors are needed that advance the capabilities of the technology.

SUMMARY

According to one embodiment of the present invention, a method is provided for fabricating a bipolar junction transistor. The method includes forming an intrinsic base layer and masking a first portion of the intrinsic base layer. In response to masking the first portion of the intrinsic base layer, a second portion of the intrinsic base layer is etched. The method further includes forming an emitter in a contacting relationship with the first portion of the intrinsic base layer.

According to another embodiment of the present invention, a bipolar junction transistor includes an intrinsic base layer with a raised region having a first portion and a second portion. The second portion of the raised region is thinner than the first portion of the raised region. An emitter is in a contacting relationship with the first portion of the intrinsic base layer, and an extrinsic base layer is in a contacting relationship with the second portion of the intrinsic base layer.

According to another embodiment of the present invention, a hardware description language (HDL) design structure is encoded on a machine-readable data storage medium. The HDL design structure comprises elements that, when processed in a computer-aided design system, generates a machine-executable representation of a bipolar junction transistor. The HDL design structure includes an intrinsic base layer including a raised region with a first portion and a second portion. The second portion of the raised region is thinner than the first portion of the raised region. An emitter is in a contacting relationship with the first portion of the intrinsic base layer, and an extrinsic base layer is in a contacting relationship with the second portion of the intrinsic base layer. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
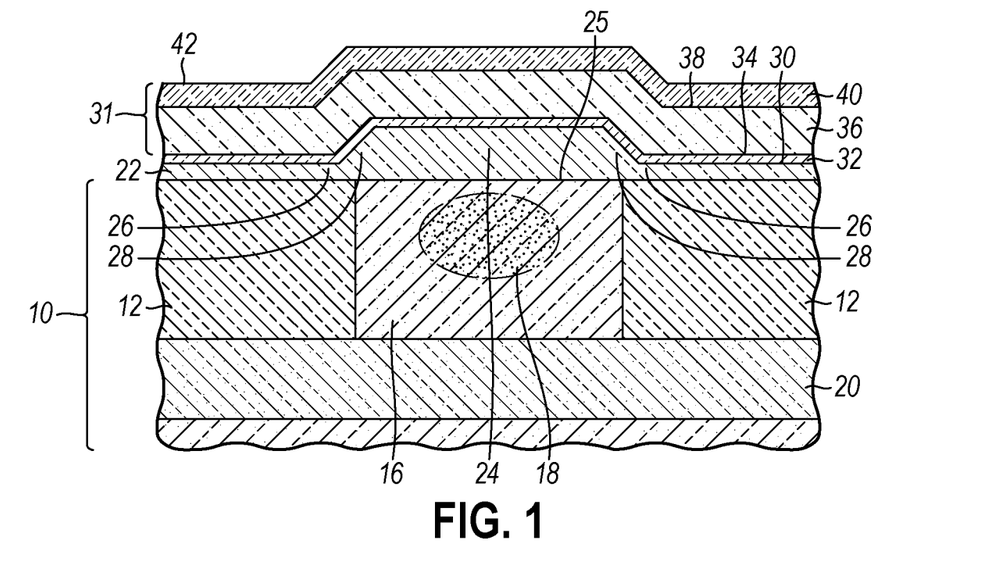
FIGS. 1-8 are cross-sectional views of a portion of a substrate at successive fabrication stages of a processing method for fabricating a bipolar junction transistor in accordance with an embodiment of the invention.
Figure 8:
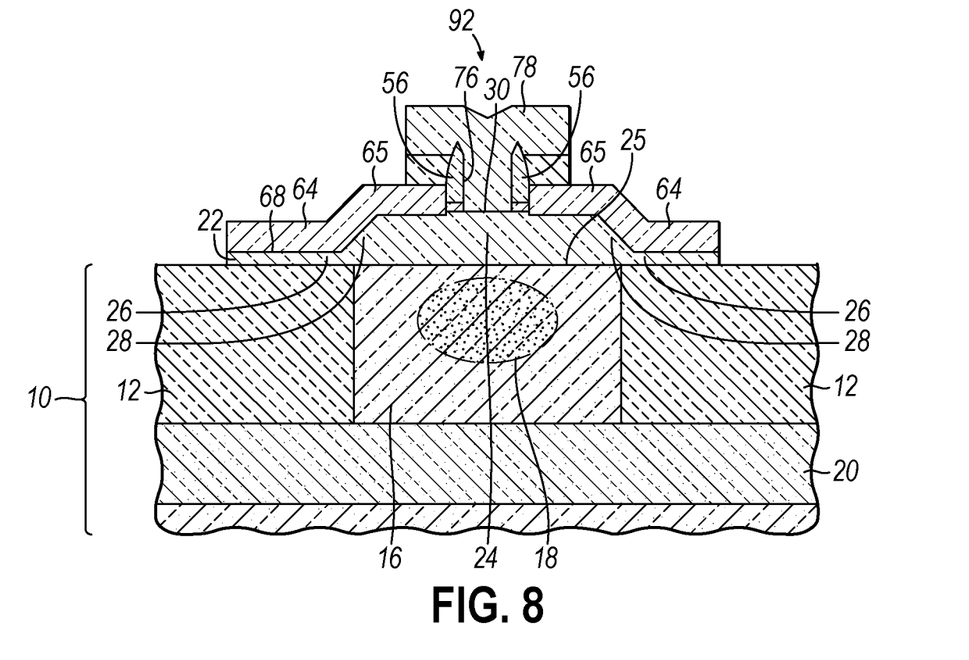

With reference to FIG. 1 and in accordance with an embodiment of the invention, a substrate 10 includes trench isolation regions 12 which circumscribe and electrically isolate a device region 16. The device region 16 is used in the fabrication of a bipolar junction transistor 92 (FIG. 8).

The substrate 10 may be any type of suitable bulk substrate comprising a semiconductor material suitable for forming an integrated circuit. For example, the substrate 10 may be a wafer comprised of a monocrystalline silicon-containing material, such as single crystal silicon wafer with a (100) crystal lattice orientation. The monocrystalline semiconductor material of the substrate 10 may contain a definite defect concentration and still be considered single crystal. The semiconductor material comprising substrate 10 may include an optional epitaxial layer on a bulk substrate, such as an epitaxial layer comprised of lightly-doped n-type semiconductor material that defines a top surface 25 and that covers an oppositely-doped bulk substrate.

The trench isolation regions 12 may be isolation structures formed by a shallow trench isolation (STI) technique that relies on a lithography and dry etching process to define closed-bottomed trenches in substrate 10, fill the trenches with dielectric, and planarize the layer relative to the top surface 25 of the substrate 10 using a chemical mechanical polishing (CMP) process. The dielectric may be comprised of an oxide of silicon, such as densified tetraethylorthosilicate (TEOS) deposited by chemical vapor deposition (CVD) or a high-density plasma (HDP) oxide deposited with plasma assistance.

A collector 18 and subcollector 20 of the bipolar junction transistor 92 are present as impurity-doped regions in device region 16. The collector 18 and subcollector 20 may be formed beneath the top surface 25 by introducing an electrically-active dopant, such as an impurity species from Group V of the Periodic Table (e.g., phosphorus (P), arsenic (As), or antimony (Sb)) effective to impart an n-type conductivity in which electrons are the majority carriers and dominate the electrical conductivity of the host semiconductor material. In one embodiment, the collector 18 and the subcollector 20 may be formed by separate ion implantations of n-type impurity species and, thereafter, annealing to activate the impurity species and lessen implantation damage using techniques and conditions familiar to one skilled in the art. In a specific embodiment, the collector 18 may comprise a selectively implanted collector (SIC) formed by implanting an n-type dopant with selected dose and kinetic energy into the central part of the device region 16 and may be formed at any appropriate point in the process flow. In a specific embodiment, the subcollector 20 may be formed by a high-current ion implantation followed by lengthy, high temperature thermal anneal process that dopes a thickness of the substrate 10 before the optional epitaxial layer is formed. During process steps subsequent to implantation, the dopant in the collector 18 may diffuse laterally and vertically such that substantially the entire central portion of device region 16 becomes doped and is structurally and electrically continuous with the subcollector 20.

An intrinsic base layer 22, which is comprised of a material suitable for forming an intrinsic base of the bipolar junction transistor 92, is deposited as a continuous additive layer on the top surface 25 of substrate 10 and, in particular on the top surface 25 of the device region 16. In the representative embodiment, the intrinsic base layer 22 directly contacts the top surface 25 of the device region 16 and a top surface of the trench isolation regions 12. The intrinsic base layer 22 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the intrinsic base layer 22 may be uniform or the germanium content of intrinsic base layer 22 may be graded or stepped across the thickness of intrinsic base layer 22. Alternatively, the intrinsic base layer 22 may be comprised of a different semiconductor material, such as silicon (Si). The intrinsic base layer 22 may be doped with one or more impurity species, such as boron and/or carbon.

Intrinsic base layer 22 may be formed using a low temperature epitaxial (LTE) growth process (typically at a growth temperature ranging from 400° C. to 850° C.). The epitaxial growth process is performed after the trench isolation regions 12 are formed. The epitaxial growth process may be non-selective as single crystal semiconductor material (e.g., single crystal silicon or SiGe) is deposited epitaxially onto any exposed crystalline surface such as the exposed top surface 25 of device region 16, and non-monocrystalline semiconductor material (e.g., polysilicon or polycrystalline SiGe) is deposited non-epitaxially onto the non-crystalline material of the trench isolation regions 12 or regions (not shown) where polycrystalline semiconductor material already exists.

The non-selectivity of the growth process causes the intrinsic base layer 22 to incorporate topography. Specifically, the intrinsic base layer 22 includes a raised region 24 above the device region 16, a non-raised region 26 surrounding the raised region 24, and a facet region 28 between the raised region 24 and the non-raised region 26. The raised region 24 of the intrinsic base layer 22 is comprised of monocrystalline semiconductor material and is laterally positioned in vertical alignment with the collector 18. A top surface of the raised region 24 is elevated relative to a plane containing the top surface 25 of the device region 16. The raised region 24 is circumscribed by the trench isolation regions 12.

The non-raised region 26 of the intrinsic base layer 22 is comprised of polycrystalline semiconductor material and overlies the trench isolation regions 12 near the raised region 24. In the absence of epitaxial seeding over the trench isolation regions 12, the non-raised region 26 forms with a low growth rate outside of the device region 16. The facet region 28 of the intrinsic base layer 22 may be comprised of a mixture of polycrystalline and monocrystalline material or comprised of primarily single crystal material in facet region 28. The thickness of the intrinsic base layer 22 may range from about 10 nm to about 600 nm with the largest layer thickness in the raised region 24 and the layer thickness of the non-raised region 26 less than the layer thickness of the raised region 24. The layer thicknesses herein are evaluated in a direction normal to the top surface 25 of substrate 10.

A base dielectric layer 32 is formed on a top surface 30 of intrinsic base layer 22 and, in the representative embodiment, directly contacts the top surface 30. The base dielectric layer 32 reproduces the topography of the underlying intrinsic base layer 22 in device region 16. The base dielectric layer 32 may be an insulating material with a dielectric constant (e.g., a permittivity) characteristic of a dielectric. In one embodiment, the base dielectric layer 32 may be a high temperature oxide (HTO) deposited using rapid thermal process (RTP) at temperatures of 500° C. or higher, and may be comprised of an oxide of silicon, such as $SiO_2$ having a nominal dielectric constant of 3.9. Alternatively, if the base dielectric layer 32 is comprised of oxide, the material of base dielectric layer 32 may be deposited by a different deposition process, by thermal oxidation of silicon (e.g., oxidation at high pressure with steam (HIPOX)), or by a combination of oxide formation techniques known to those of ordinary skill in the art.

A sacrificial layer stack 31 including sacrificial layers 36, 40 is then formed. Sacrificial layer 36 is deposited on a top surface 34 of base dielectric layer 32 and directly contacts the top surface 34. Sacrificial layer 40, which is optional, is deposited on a top surface 38 of sacrificial layer 36. The sacrificial layers 36, 40 reproduce the topography of the underlying intrinsic base layer 22.

Sacrificial layer 36 may be comprised of a material with a different etching selectivity than the material of the underlying base dielectric layer 32. In one embodiment, sacrificial layer 36 may be comprised of polycrystalline silicon (e.g., polysilicon) deposited by a conventional deposition process such as low pressure chemical vapor phase deposition (LPCVD) using either silane or disilane as a silicon source or physical vapor deposition (PVD). Sacrificial layer 40 may be comprised of a dielectric material with a different etching selectivity than the material of the underlying sacrificial layer 36. In one embodiment, sacrificial layer 40 may be comprised of $Si_3N_4$ deposited by CVD or another suitable deposition process.

Figure 2:
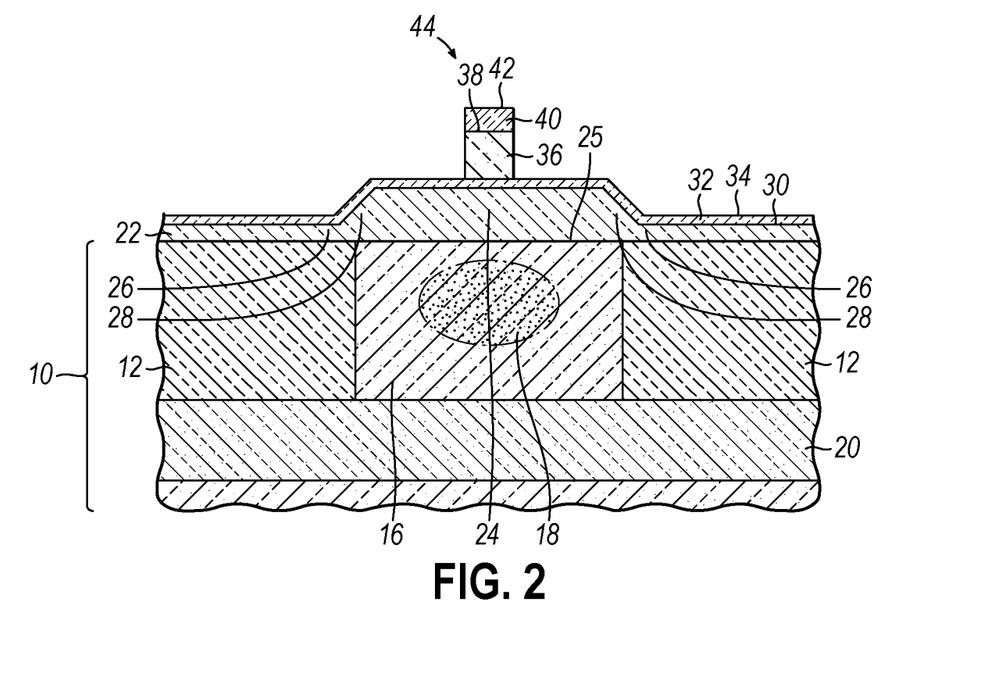

With reference to FIG. 2 in which like reference numerals refer to like features in FIG. 1 and at a subsequent fabrication stage, the sacrificial layers 36, 40 of the sacrificial layer stack 31 are patterned using photolithography and etching processes to define sacrificial mandrels in the form of a sacrificial emitter pedestal 44. To that end, the sacrificial layer stack 31 is masked with a patterned mask layer (not shown). In one embodiment, the mask layer may be a photoresist layer comprised of a sacrificial organic material applied to the top surface 42 of sacrificial layer 40 by spin coating and pre-baked. The photolithography process entails exposing the photoresist layer to radiation imaged through a photomask, baking, and developing the resultant latent feature pattern in the exposed resist to define residual areas of photoresist that mask portions of sacrificial layer stack 31. In particular, the mask includes resist strips covering respective surface areas on a top surface 42 of sacrificial layer 40 at the intended locations of the sacrificial emitter pedestal 44.

An etching process, such as a reactive-ion etching (RIE) process, is used to remove regions of sacrificial layers 36, 40 not protected by the mask layer. For example, an initial segment of the etching process may remove unprotected regions of sacrificial layer 40 and stop on the material of sacrificial layer 36. The etch chemistry may be changed to remove unprotected regions of the underlying sacrificial layer 36 and stop on the material of base dielectric layer 32. Alternatively, a simpler etch chemistry might be used that includes fewer etch steps. At the conclusion of the etching process, the top surface 34 of base dielectric layer 32 is exposed aside from the portions of the top surface 34 covered by the sacrificial emitter pedestal 44.

Figure 3:
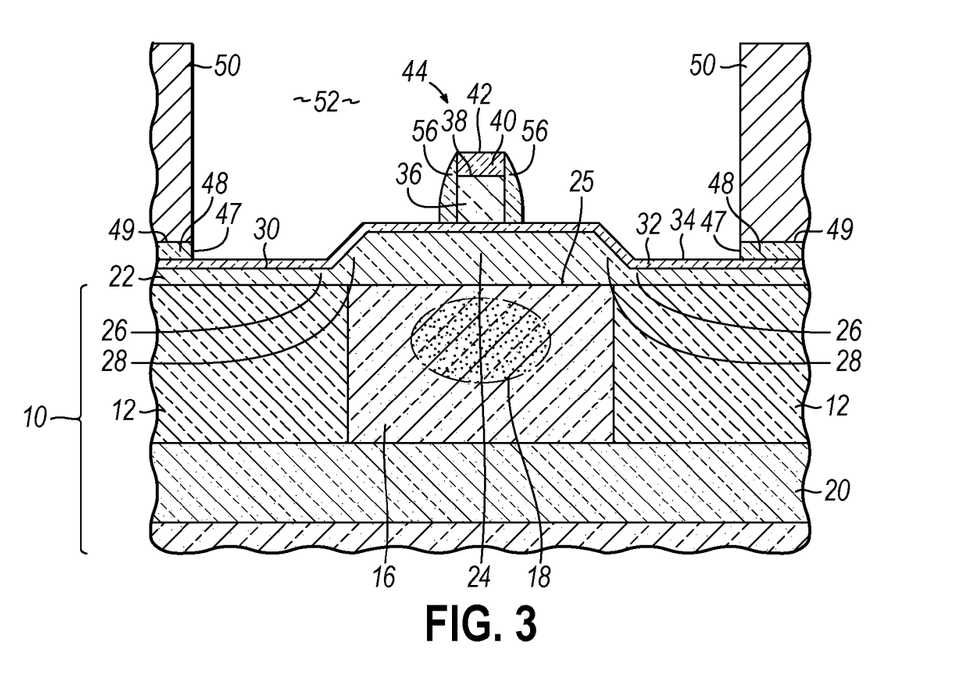

With reference to FIG. 3 in which like reference numerals refer to like features in FIG. 2 and at a subsequent fabrication stage, a hardmask layer 48 is deposited on a top surface 34 of base dielectric layer 32 and directly contacts the top surface 34. The hardmask layer 48 may be a conformal blanket layer with a thickness that is independent of the topography of underlying features, such as the sacrificial emitter pedestal 44. Hardmask layer 48 may be comprised of a dielectric material with a different etching selectivity than the underlying base dielectric layer 32. In one embodiment, hardmask layer 48 may be comprised of silicon nitride ($Si_3N_4$) deposited using CVD. Alternatively, the material of hardmask layer 48 may be deposited by another suitable deposition process.

After hardmask layer 48 is deposited, a resist layer 50 comprised of a radiation-sensitive organic material is applied to a top surface 49 of hardmask layer 48 by spin coating, pre-baked, exposed to radiation to impart a latent image of a pattern including a window 52 to expose surface areas spatially registered with the device region 16 for bipolar junction transistor 92, baked, and then developed with a chemical developer. Window 52 is defined as an opening in the resist layer 50.

A directional anisotropic etching process like RIE that preferentially removes dielectric material from horizontal surfaces, may be used to remove portions of the hardmask layer 48 in regions unmasked by the resist layer 50 to extend the window 52. In particular, an opening with an interior edge 47 is defined in the hardmask layer 48 at the location of window 52 and extends through the hardmask layer 48 to the top surface 30 of base dielectric layer 32. In one embodiment, the etching process is selected with an etch chemistry that selectively removes $Si_3N_4$ in hardmask layer 48 relative to $SiO_2$ in the base dielectric layer 32. The etching process also etches the hardmask layer 48 to form non-conductive spacers 56 on the sidewalls of the sacrificial emitter pedestal 44. The non-conductive spacers 56 surround the sidewalls of the sacrificial emitter pedestal 44. Following the etching process, the resist layer 50 is removed by oxygen plasma ashing and/or wet chemical stripping.

Figure 4:
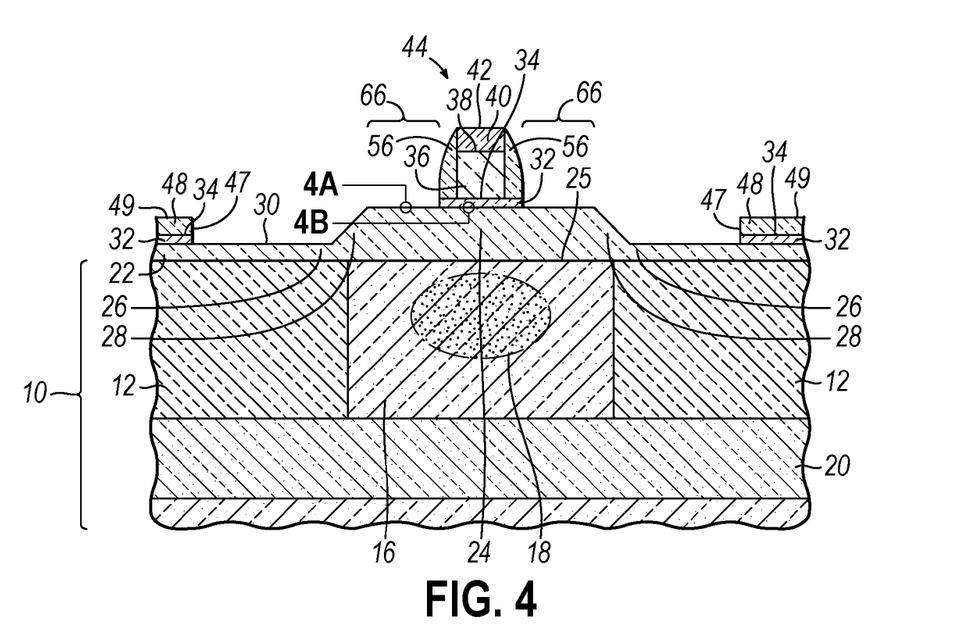

With reference to FIG. 4 in which like reference numerals refer to like features in FIG. 3 and at a subsequent fabrication stage, the base dielectric layer 32 is removed by an etching process that stops on the material constituting intrinsic base layer 22. At the conclusion of the etching process, the top surface 30 of intrinsic base layer 22 is exposed in device region 16. During the etching process, the patterned hardmask layer 48 operates as a hardmask to selectively mask portions of base dielectric layer 32 outside of the device region 16. The sacrificial emitter pedestal 44 and non-conductive spacers 56 also respectively mask surface areas of the base dielectric layer 32 during the etching process.

At the conclusion of the etching process, a portion of the top surface 30 of intrinsic base layer 22 is exposed between the interior edge 47 of the opening in the hardmask layer 48 and the non-conductive spacers 56 on the sacrificial emitter pedestal 44. This portion of the top surface 30 is an intended location for the extrinsic base layer 64 of the bipolar junction transistor 92.

In one embodiment, the etching process may be chemical oxide removal (COR) that removes the material of base dielectric layer 32, if comprised of $SiO_2$, with minimal undercut beneath the non-conductive spacers 56. A COR process utilizes a vapor or, more preferably, a mixture flow of hydrogen fluoride (HF) and ammonia ($NH_3$) in a ratio of 1:10 to 10:1 and may be performed at low pressures (e.g., of about 1 mTorr to about 100 mTorr) and room temperature. The COR process may be performed in situ in the deposition chamber or may be performed in an independent chamber. Sacrificial layer 40 remains unchanged as a structure of the sacrificial layer stack 31 following the etching process. An optional hydrofluoric acid chemical cleaning procedure may follow the COR process.

Figure 4A:
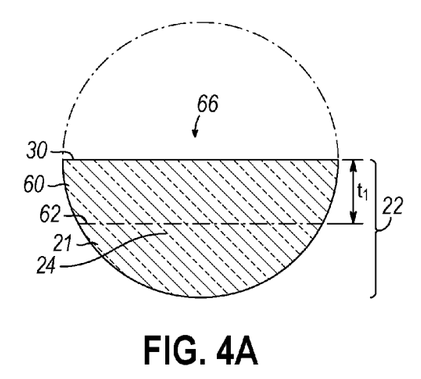
FIG. 4A is a detailed view of the region 4A in FIG. 4.
Figure 4B:
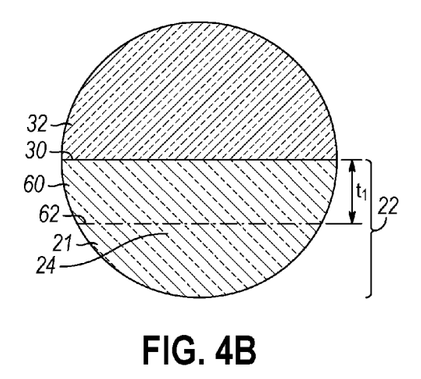
FIG. 4B is a detailed view of the region 4B in FIG. 4.

As apparent in FIGS. 4A and 4B, the intrinsic base layer 22 has an interface layer 60 adjacent to the top surface 30. The interface layer 60 represents a thin surface layer that is significantly thinner than a bulk layer 21 of the intrinsic base layer 22 and that has an interface 62 with the bulk layer 21 of the intrinsic base layer 22. The interface layer 60 has a layer thickness, $t_1$, of the interface layer 60, which is measured as a normal distance from the interface 62 to the top surface 30. The layer thickness, $t_1$, in field regions 66 that flank the sacrificial emitter pedestal 44 and non-conductive spacers 56 is nominally equal to the layer thickness, $t_1$, beneath the sacrificial emitter pedestal 44 and non-conductive spacers 56. In other words, the layer thickness, $t_1$, is independent of lateral position proximate to device region 16.

The interface layer 60 may have a different nominal composition than a region of the bulk layer intrinsic base layer 22 adjacent to interface 62. In one embodiment, a Si seed layer free of Ge may be grown and then the intrinsic base layer 22 may be deposited with a graded profile of Ge concentration. In a representative trapezoidal profile, the Ge concentration of the bulk layer 21 is ramped upward from the growth initiation on the Si seed layer and then fixed at a constant percentage over a plateau within the bulk layer 21 of the intrinsic base layer 22. The Ge concentration of the bulk layer 21 is then ramped downwardly from the plateau as the full thickness for the bulk layer 21 is approached. At the interface 62, the downwardly ramped Ge concentration may reach zero so that the interface layer 60 is comprised of intrinsic Si with a negligible Ge concentration. Alternatively, the downwardly ramped Ge concentration may be non-zero near the top surface 30 of the intrinsic base layer 22 so that the interface layer 60 is SiGe comprised of five percent or less of Ge, but still has a lower Ge content than the region of the bulk layer 21 adjacent to the interface 62. In another embodiment, the interface layer 60 may not be initially doped with the impurity species (e.g., boron and/or carbon) used to dope the bulk layer 21 of the intrinsic base layer 22.

Figure 5:
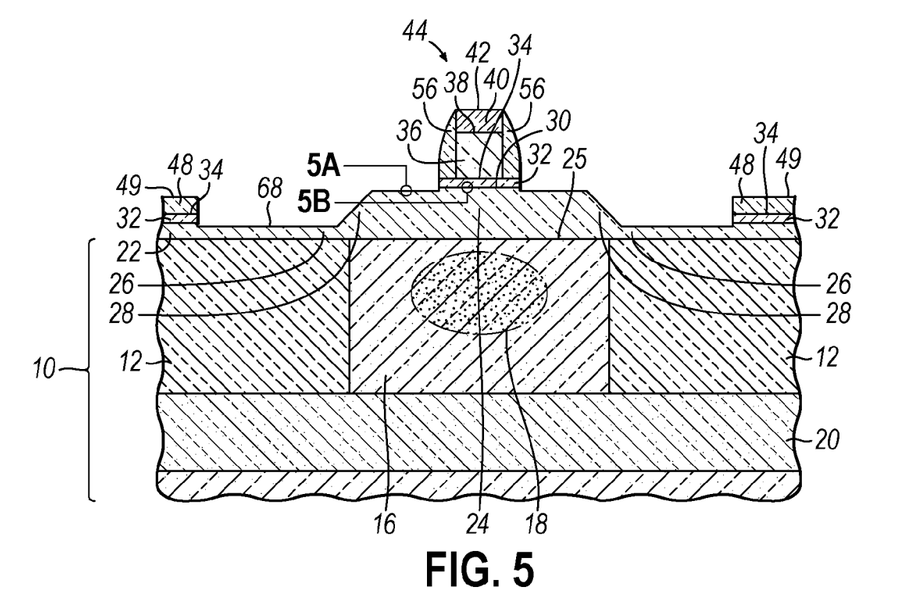

With reference to FIG. 5 in which like reference numerals refer to like features in FIG. 4 and at a subsequent fabrication stage, an etching process may be used to reduce the thickness of the interface layer 60 in the field regions 66, thereby reducing the thickness of the intrinsic base layer 22 in the field regions 66. If the interface layer 60 is comprised of Si or primarily of Si, then a RIE process using a chlorine-based chemistry (e.g., HCl) may be used to reduce the thickness of the interface layer 60 in the field regions 66.

Figure 5A:
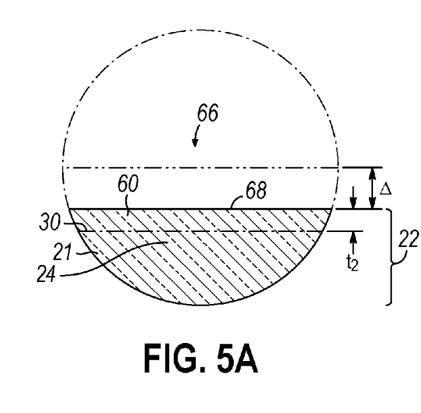
FIG. 5A is a detailed view of the region 5A in FIG. 5.

In the representative embodiment and as apparent in FIG. 5A, the interface layer 60 in the field regions 66 has been thinned by the etching process to a nominal layer thickness, $t_2$, which is measured as a normal distance between a recessed top surface 68 of the intrinsic base layer 22 and the interface 62 between the interface layer 60 and the bulk layer 21 of the intrinsic base layer 22. The top surface 68 in the field regions 66 is recessed relative to the top surface 30 beneath the sacrificial emitter pedestal 44 and non-conductive spacers 56 by a distance equal to a thickness, $\Delta$, of interface layer 60 removed by the etching process. The removed thickness, $\Delta$, in the field regions 66 is smaller than the initial layer thickness, $t_1$, of the interface layer 60 and represents the difference between the layer thicknesses $t_1$ and $t_2$. If the interface layer 60 is completely removed in the field regions 66, then the removed thickness, $\Delta$, is equal to the initial layer thickness, $t_1$, and the top surface 30 of the intrinsic base layer 22 is exposed.

Figure 5B:
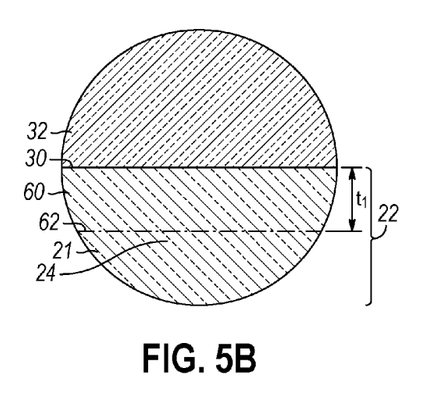
FIG. 5B is a detailed view of the region 5B in FIG. 5.

As best shown in FIG. 5B, the sacrificial emitter pedestal 44 and non-conductive spacers 56 respectively mask surface areas of the interface layer 60 during the etching process. As a result, the initial thickness, $t_1$, of the interface layer 60 is preserved beneath the sacrificial emitter pedestal 44 and non-conductive spacers 56. As mentioned above, the difference between the layer thicknesses $t_1$, $t_2$ is equal to the removed thickness, $\Delta$. The result of the etching process is that the layer thickness, $t_2$, of the intrinsic base layer 22 differs in the field regions 66 from the layer thickness, $t_1$, of the intrinsic base layer 22 beneath the sacrificial emitter pedestal 44 and non-conductive spacers 56.

In an alternative embodiment, the interface layer 60 may be completely removed from the field regions 66. In this instance, the removed thickness, $\Delta$, of the intrinsic base layer 22 will be nominally equal to the layer thickness $t_1$ of the interface layer 60. In another alternative embodiment, the etching process may remove a partial thickness of the bulk layer 21 of the intrinsic base layer 22 in the field regions 66 after the interface layer 60 is completely removed from the field regions 66. In this instance, the removed thickness, $\Delta$, of the intrinsic base layer 22 will be greater than the layer thickness $t_1$.

Figure 6:
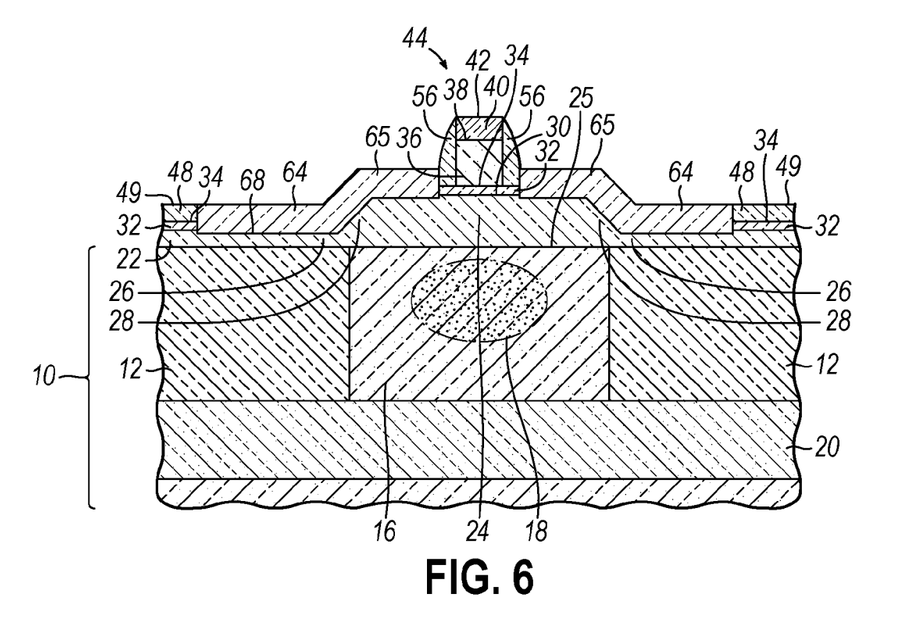

With reference to FIG. 6 in which like reference numerals refer to like features in FIG. 5 and at a subsequent fabrication stage, an extrinsic base layer 64 is formed on the recessed top surface 68 of intrinsic base layer 22 and, in the representative embodiment, directly contacts the top surface 68. In one embodiment, the extrinsic base layer 64 may be comprised of a semiconductor material (e.g., silicon or SiGe) formed by a selective epitaxial growth (SEG) deposition process. If comprised of SiGe, the concentration of Ge may have a graded or an abrupt profile if the extrinsic base layer 64 is comprised of SiGe, and may include additional layers, such as a Si cap. Epitaxial growth is a process by which a layer of single-crystal material (extrinsic base layer 64) is deposited on a single-crystal substrate (intrinsic base layer 22) and in which the crystallographic structure of the single-crystal substrate is reproduced in the extrinsic base layer 64. If the chemical composition of the epitaxial material in the extrinsic base layer 64 differs from the chemical composition of the intrinsic base layer 22, then a lattice constant mismatch may be present between the epitaxial material of extrinsic base layer 64 and the intrinsic base layer 22.

In an SEG deposition process, nucleation of the constituent semiconductor material is suppressed on insulators, such as on the top surface 49 of the hardmask layer 48 and on the non-conductive spacers 56. The selectivity of the SEG deposition process forming the extrinsic base layer 64 may be provided by an etchant, such as hydrogen chloride (HCl), in the reactant stream supplied to the SEG reaction chamber or by the germanium source, such as germane ($GeH_4$) or digermane ($Ge_2H_6$), supplied to the SEG reaction chamber. If the extrinsic base layer 64 does not contain germanium, then a separate etchant may be supplied to the SEG reaction chamber to provide the requisite selectivity. If the extrinsic base layer 64 contains germanium formed using a germanium source gas, the provision of an additional etchant to the SEG reaction chamber is optional.

The thinning of the intrinsic base layer 22 in the field regions 66 in preparation for the growth of extrinsic base layer 64 may be performed with an etching process in the same tool used to deposit the extrinsic base layer 64. In this manner, exposure to atmosphere is necessarily avoided. Alternatively, the substrate 10 may be moved between different chambers in a tool or between different tools with minimal exposure to atmosphere for sequentially performing the sequential etching and deposition processes.

The extrinsic base layer 64 may be in situ doped during deposition with a concentration of a dopant, such as an impurity species from Group III of the Periodic Table (e.g., boron or indium) effective to impart a p-type conductivity in which holes are the majority carriers and dominate the electrical conductivity of the host semiconductor material. The extrinsic base layer 64 may comprise heavily-doped p-type semiconductor material. The uneven topography of the underlying intrinsic base layer 22 might be partially reproduced in the extrinsic base layer 64 on device region 16 so that the extrinsic base layer 64 has a raised region 65 that overlies the raised region 24 of the intrinsic base layer 22.

During the various thermal processes of the process flow, the impurity species may be caused to diffuse from the extrinsic base layer 64 into the intrinsic base layer 22. As a result, the intrinsic base layer 22 near the top surface 68 may become doped with an appropriate concentration of the impurity species so that a low-resistance link to the intrinsic base layer 22 is formed.

The material in the extrinsic base layer 64 is ultimately used to form an extrinsic base of a bipolar junction transistor 92, which is a NPN bipolar junction transistor in the representative embodiment. During the SEG deposition process, the semiconductor material of the raised region 24 and facet region 28 of intrinsic base layer 22 operates as a seed crystal or crystalline seed that establishes a crystallographic pattern for the semiconductor material of the extrinsic base layer 64 grown on the raised region 24. The crystallographic pattern of the raised region of intrinsic base layer 22 is reproduced during selective epitaxy in extrinsic base layer 64 over raised region 24 and facet region 28 so that this region of the extrinsic base layer 64 has approximately the same lattice structure and crystalline orientation as intrinsic base layer 22 taking into account any differences in lattice constant from dissimilar material compositions.

Figure 7:
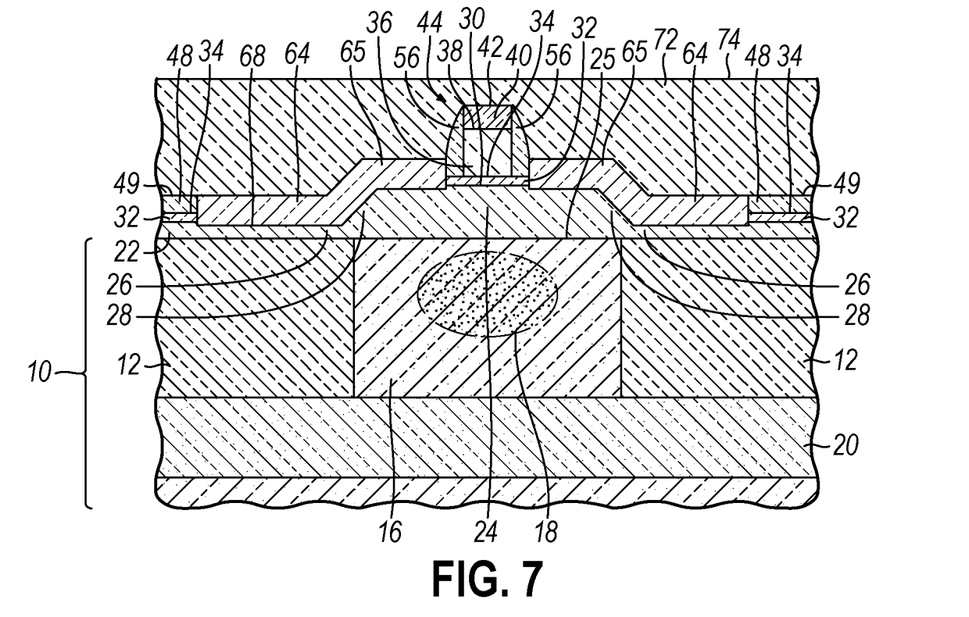

With reference to FIG. 7 in which like reference numerals refer to like features in FIG. 6 and at a subsequent fabrication stage, an insulator layer 72 is deposited that buries the sacrificial emitter pedestal 44. The insulator layer 72 may be comprised of a dielectric, which is an insulating material having a dielectric constant (e.g., permittivity) characteristic of a dielectric material. In one embodiment, insulator layer 72 may be comprised of $SiO_2$ formed by plasma-enhanced CVD (PECVD) or another suitable deposition process. A top surface 74 of the insulator layer 72 is planarized using a chemical-mechanical polishing (CMP) process so that the top surface 74 is flat. The CMP process combines abrasion and dissolution to remove a thickness of the insulator layer 72 so that the non-planar topography of the top surface 74 from the presence of the sacrificial emitter pedestal 44 is reduced or eliminated, and the top surface 74 is thereby flattened. The CMP process is controlled such that the sacrificial emitter pedestal 44 remains buried beneath the top surface 74 of the insulator layer 72.

With reference to FIG. 8 in which like reference numerals refer to like features in FIG. 7 and at a subsequent fabrication stage, the top surface 74 of insulator layer 72 is further recessed relative to the sacrificial emitter pedestal 44 by an etching process, such as RIE. Sacrificial layer 40, which is exposed by the recession of insulator layer 72, is then removed from its position between the non-conductive spacers 56. Sacrificial layer 40 may be removed from the sacrificial emitter pedestal 44 using a suitable wet chemical etch or RIE with a suitable etch chemistry.

Sacrificial layer 36, which is exposed after the removal of sacrificial layer 40, is removed from its position between the non-conductive spacers 56 on the sacrificial emitter pedestal 44. Sacrificial layer 36 may be etched using dry etching process that removes the material of sacrificial layer 36 selective to the materials of base dielectric layer 32, non-conductive spacers 56, and base dielectric layer 32. The etching process stops upon reaching the top surface 34 of the base dielectric layer 32. An etching process such as a hydrofluoric acid type procedure like a dilute hydrofluoric (DHF) or a buffered hydrofluoric (BHF) wet procedure, or a COR process is then applied to remove portions of the base dielectric layer 32 not covered by the non-conductive spacers 56.

As a result of the removal of the sacrificial emitter pedestal 44 from between the non-conductive spacers 56, an emitter window 76 is formed between the non-conductive spacers 56. The emitter window 76 extends from the apex of the non-conductive spacers 56 to the top surface 30 of intrinsic base layer 22.

An emitter 78 of the bipolar junction transistor 92 is formed in the emitter window 76. The non-conductive spacers 56 respectively encircle or surround the emitter 78 for electrically isolating the emitter 78 from the extrinsic base layer 64. The emitter 78 contacts, and may directly contact, the raised region 24 of intrinsic base layer 22 and, therefore, the intrinsic base of bipolar junction transistor 92.

The emitter 78 of the bipolar junction transistor 92 may be formed by depositing a layer comprised of a heavily-doped semiconductor material and then patterning the deposited layer using lithography and etching processes. For example, the emitter 78 may be formed from polysilicon deposited by CVD or LPCVD and heavily doped with a concentration of a dopant, such as an impurities species from Group V of the Periodic Table (e.g., arsenic) to impart n-type conductivity. The heavy-doping level modifies the resistivity of the polysilicon and may be implemented by in situ doping that adds a dopant gas to the CVD reactant gases during the deposition process.

The lithography process forming the emitter 78 from the layer of heavily-doped semiconductor material may utilize photoresist and photolithography to form an etch mask that protects only a strip of the heavily-doped semiconductor material registered with the emitter window 76. An etching process that stops on the material of insulator layer 72 is selected to shape the emitter 78 from the protected strip of heavily-doped semiconductor material. The mask is subsequently stripped, which exposes the top surface 74 of insulator layer 72 surrounding the emitter 78.

The insulating layer 70, the extrinsic base layer 64, and the intrinsic base layer 22 may be patterned using conventional photolithography and etching processes to define an extrinsic base and an intrinsic base of the bipolar junction transistor 92. The extrinsic base layer 64 is separated from the emitter 78 by the non-conductive spacers 56. Sections of insulating layer 70 may be retained between the extrinsic base layer 64 and the emitter 78.

The emitter 78, intrinsic base layer 22, and collector 18 of the bipolar junction transistor 92 are vertically arranged. The intrinsic base layer 22 is located vertically between the emitter 78 and the collector 18. One p-n junction is defined at the interface between the emitter 78 and the intrinsic base layer 22. Another p-n junction is defined at the interface between the collector 18 and the intrinsic base layer 22.

The etching process that provides the differential layer thicknesses for the intrinsic base layer 22 affords independent, local control over the layer thickness and, in particular, over the layer thickness of the interface layer 60. In the field regions 66, the extrinsic base layer 64 contacts the top surface 68 of intrinsic base layer 22 to establish an extrinsic base-intrinsic base interface. The deliberate thinning or removal of the interface layer 60 permits closer spacing between the extrinsic base layer 64 and the bulk layer 21 of the intrinsic base layer 22. The consequence is that base resistance $R_b$ may be significantly reduced without a significant thermal anneal to drive the impurity species from the extrinsic base layer 64 to the intrinsic base layer 22 and thereby dope an adjacent thickness of the intrinsic base layer 22 to reduce its conductivity and provide a reduced-resistance link between the intrinsic base layer 22 and extrinsic base layer 64. The base resistance $R_b$ is a significant parasitic because it provides an electrical feedback path between the output and input of the bipolar junction transistor 92. The reduction in the base resistance may improve the performance of the bipolar junction transistor 92 by increasing speed of the device, e.g., an important figure of merit, $f_{max}$, which is a function of base resistance $R_b$.

The emitter 78 directly contacts a portion of the intrinsic base layer 22 for which the interface layer 60 retains the initial layer thickness, $t_1$, to establish an emitter-base interface. The maintained thickness for the interface layer 60 in direct contact with the emitter 78 may be needed to meet design metrics, such as a specified base-emitter voltage $V_{be}$ at a specified collector current.

During the front-end-of-line (FEOL) portion of the fabrication process, the device structure of the bipolar junction transistor 92 may be replicated across different portions of the surface area of the substrate 10. In BiCMOS integrated circuits, complementary metal-oxide-semiconductor (CMOS) transistors may be formed using other regions of the substrate 10. As a result, both bipolar and CMOS transistors available on the same substrate 10.

Standard back-end-of-line (BEOL) processing follows, which includes formation of wiring lines and via plugs in dielectric layers to form an interconnect structure coupled with the bipolar junction transistor 92, as well as other device structures like bipolar junction transistor 92 and optionally CMOS transistors (not shown) included in other circuitry fabricated on the substrate 10. Passive circuit elements, such as diodes, resistors, capacitors, varactors, and inductors, may be fabricated in the interconnect structure and available for use in the BiCMOS integrated circuit.

Figure 9:
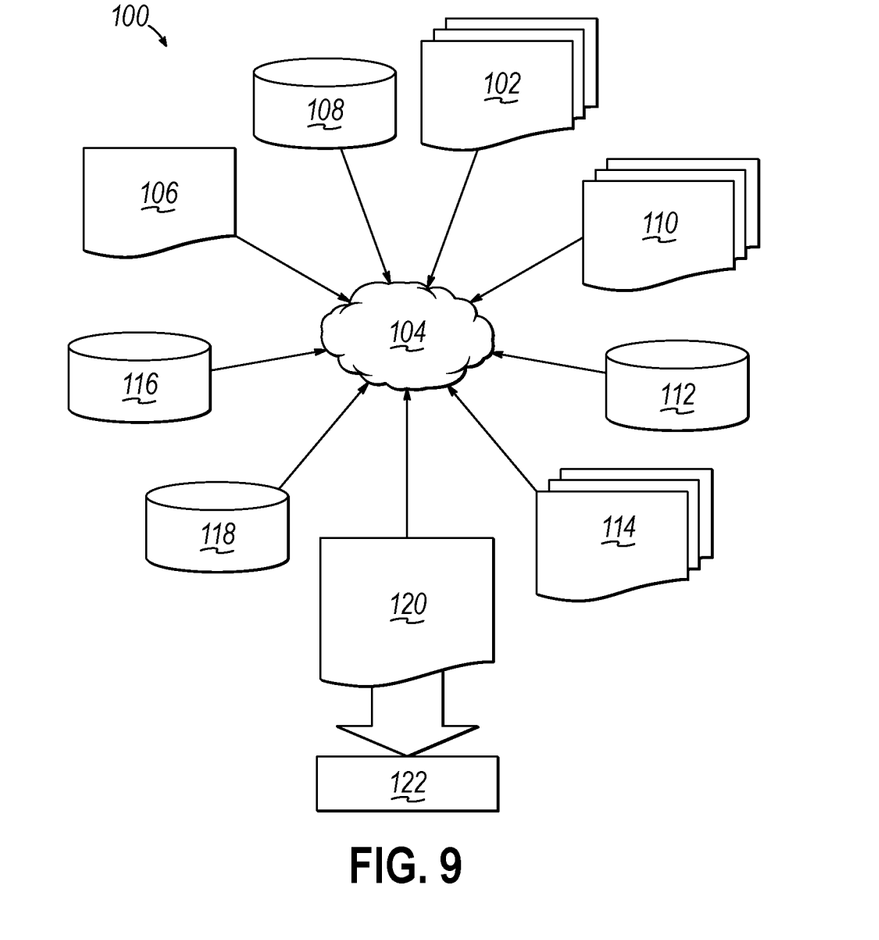
FIG. 9 is a flow diagram of a design process used in semiconductor design, manufacture, and/or test.

FIG. 9 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIG. 8. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIG. 8. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIG. 8 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 84 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 8. In one embodiment, design structure 120 may comprise a compiled, executable HDL simulation model that functionally simulates the devices shown in FIG. 8.

Design structure 120 may also employ a data format used for the exchange of layout data of integrated circuits and/or symbolic data format (e.g., information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 8. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. The term "lateral" refers to a dimension within the horizontal plane.

It will be understood that when an element is described as being "connected" or "coupled" to or with another element, it can be directly connected or coupled with the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A bipolar junction transistor comprising:
   an intrinsic base layer including a raised region with a first portion and a second portion, the second portion of the raised region being thinner than the first portion of the raised region, the intrinsic base layer including a top surface, a bulk layer, and an interface layer between the bulk layer and the top surface, the interface layer comprised of silicon, the bulk layer comprised of silicon-germanium, the interface layer of the first portion of the raised region has a first thickness, and the interface layer of the second portion of the raised region has a second thickness that is less than the first thickness;
   an emitter in a contacting relationship with the interface layer of the first portion of the raised region of the intrinsic base layer at the top surface; and
   an extrinsic base layer in a contacting relationship with the interface layer of the second portion of the raised region of the intrinsic base layer at the top surface,
   wherein the emitter and the first portion of the raised region of the raised region of the intrinsic base layer are vertically arranged, and a p-n junction is located at an interface between the interface layer of the intrinsic base layer and the emitter.

2. The bipolar junction transistor of claim 1 wherein the interface layer has a first thickness over the first portion of the raised region of the intrinsic base layer, the interface layer has a second thickness over the second portion of the raised region of the intrinsic base layer, and the second thickness is smaller than the first thickness.

3. The bipolar junction transistor of claim 1 wherein further comprising:
   a plurality of shallow trench isolation regions defining a device region, the device region aligned with the raised region of the intrinsic base layer; and
   a collector in the device region, the collector comprised of a first semiconductor material having an opposite conductivity type from the intrinsic base layer.

4. The bipolar junction transistor of claim 3 wherein the first portion of the raised region of the intrinsic base layer is disposed between the collector and the emitter.

5. The bipolar junction transistor of claim 1 further comprising:
   a plurality of non-conductive spacers on the emitter,
   wherein the extrinsic base layer is self-aligned with the non-conductive spacers.

6. A hardware description language (HDL) design structure encoded on a machine-readable data storage medium, the HDL design structure comprising elements that when processed in a computer-aided design system generates a machine-executable representation of a bipolar junction transistor, the HDL design structure comprising:

an intrinsic base layer including a raised region with a first portion and a second portion, the second portion of the raised region being thinner than the first portion of the raised region, the intrinsic base layer including a top surface, a bulk layer, and an interface layer between the bulk layer and the top surface, the interface layer comprised of silicon, and the bulk layer comprised of silicon-germanium, the interface layer of the first portion of the raised region has a first thickness, and the interface layer of the second portion of the raised region has a second thickness that is less than the first thickness;

an emitter in a contacting relationship with the interface layer of the first portion of the raised region of the intrinsic base layer at the top surface; and an extrinsic base layer in a contacting relationship with the interface layer of the second portion of the raised region of the intrinsic base layer at the top surface, wherein the emitter and the first portion of the raised region of the raised region of the intrinsic base layer are vertically arranged, and a p-n junction is located at an interface between the interface layer of the intrinsic base layer and the emitter.

7. The HDL design structure of claim 6 wherein the HDL design structure comprises a netlist.

8. The HDL design structure of claim 6 wherein the HDL design structure resides on storage medium as a data format used for the exchange of layout data of integrated circuits.

9. The HDL design structure of claim 6 wherein the HDL design structure resides in a programmable gate array.

10. The bipolar junction transistor of claim 1 further comprising:

a collector vertically arranged with the first portion of the raised region of the intrinsic base layer and the emitter, the collector in a contacting relationship with the bulk layer of the intrinsic base layer, and the collector separated from the emitter by the interface layer and bulk layer of the intrinsic base layer.

* * * * *